United States Patent
Komatsuzaki et al.

(10) Patent No.: US 10,608,594 B2
(45) Date of Patent: Mar. 31, 2020

(54) DOHERTY AMPLIFIER

(71) Applicant: Mitsubishi Electric Corporation, Tokyo (JP)

(72) Inventors: Yuji Komatsuzaki, Tokyo (JP); Shintaro Shinjo, Tokyo (JP); Keigo Nakatani, Tokyo (JP); Shohei Imai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/097,844

(22) PCT Filed: May 18, 2016

(86) PCT No.: PCT/JP2016/064723
§ 371 (c)(1),
(2) Date: Oct. 31, 2018

(87) PCT Pub. No.: WO2017/199366
PCT Pub. Date: Nov. 23, 2017

(65) Prior Publication Data
US 2019/0149097 A1    May 16, 2019

(51) Int. Cl.
*H03F 1/02* (2006.01)
*H03F 1/42* (2006.01)
(Continued)

(52) U.S. Cl.
CPC ............ *H03F 1/0288* (2013.01); *H03F 1/07* (2013.01); *H03F 1/42* (2013.01); *H03F 1/56* (2013.01);
(Continued)

(58) Field of Classification Search
USPC .................. 330/295, 124 R, 84, 286, 53–54
See application file for complete search history.

(56) References Cited

U.S. PATENT DOCUMENTS 9,209,511 B2 * 12/2015 Mei ........................... H01P 5/12
9,496,836 B2 * 11/2016 Qureshi ................. H03F 3/193
(Continued)

FOREIGN PATENT DOCUMENTS

JP    H09-205304 A    8/1997
JP    2006-157900 A    6/2006
(Continued)

OTHER PUBLICATIONS

International Search Report issued in PCT/JP2016/064723; dated Aug. 9, 2016.
(Continued)

*Primary Examiner* — Hieu P Nguyen
(74) *Attorney, Agent, or Firm* — Studebaker & Brackett PC

(57) ABSTRACT

In a Doherty amplifier including a carrier amplifier (6) and a peaking amplifier (8) connected in parallel with each other, a compensation circuit (9) for causing an impedance seen from an output end (9a) of the compensation circuit (9) toward the peaking amplifier (8) to be open within a used frequency range and compensating for frequency dependence of an impedance seen from an output of a combiner (10) toward the combiner (10) in a state in which the peaking amplifier (8) is not operating is arranged between the peaking amplifier (8) and the combiner (10). This achieves a wider bandwidth without making the circuit larger in size and more complicated.

4 Claims, 6 Drawing Sheets

(51) Int. Cl.
  *H03F 1/56*    (2006.01)
  *H03F 3/68*    (2006.01)
  *H03F 1/07*    (2006.01)
(52) U.S. Cl.
  CPC ........... *H03F 3/68* (2013.01); *H03F 2200/36* (2013.01); *H03F 2200/451* (2013.01)

(56) References Cited

U.S. PATENT DOCUMENTS

2006/0097783 A1    5/2006  Okubo et al.
2012/0235734 A1    9/2012  Pengelly

FOREIGN PATENT DOCUMENTS

| JP | 2006-345341 A | 12/2006 |
| JP | 2009-055515 A | 3/2009 |
| JP | 2009-284005 A | 12/2009 |
| JP | 2010-021719 A | 1/2010 |
| JP | 4627457 B2 | 2/2011 |
| JP | 2014-511166 A | 5/2014 |

OTHER PUBLICATIONS

Andrei Grebennikov et al., "A Dual-Band Parallel Doherty Power Amplifier for Wireless Applications", IEEE Transactions on Microwave Theory and Techniques, Oct. 2012, pp. 3214-3222, vol. 60, No. 10.

Extended European Search Report issued by the European Patent Office dated Apr. 26, 2019, which corresponds to EP16902385.0-1203 and is related to U.S. Appl. No. 16/097,844.

* cited by examiner

DOHERTY AMPLIFIER

TECHNICAL FIELD

The present disclosure relates to Doherty amplifiers in which a carrier amplifier and a peaking amplifier are connected in parallel.

BACKGROUND ART

In recent years, Doherty amplifiers that achieve highly efficient operation have been proposed as amplifiers for communication.

A Doherty amplifier includes a carrier amplifier and a peaking amplifier connected in parallel, and a 90-degree line for performing load modulation loaded at the output of the carrier amplifier, to achieve highly efficient operation during back-off operation in which output power is lower than saturation power. The back-off operation refers to a state in which the peaking amplifier is not operating.

In the Doherty amplifier, however, the electrical length of the 90-degree line may deviate, in principle of operation, from 90 degrees owing to the frequency dependence of the 90-degree line loaded at the output of the carrier amplifier, thus resulting in narrow bandwidth of the operation.

Patent Literature 1 mentioned below discloses a Doherty amplifier including a plurality of lines having different electrical lengths at the output of a carrier amplifier, and including a control mechanism for selecting a line to be connected to the output of the carrier amplifier from the plurality of lines having different electrical lengths according to the frequency of an input signal.

The control mechanism serves to make the electrical length of a line at the output of the carrier amplifier closer to 90 degrees.

CITATION LIST

Patent Literatures

Patent Literature 1: JP 2006-345341 A

SUMMARY OF INVENTION

Technical Problem

Since the Doherty amplifier of the related art is configured as described above, the electrical length of a line at the output of the carrier amplifier can be made closer to 90 degrees. However, because a detection mechanism for detecting the frequency of an input signal and the control mechanism for selecting a line to be connected with the output of the carrier amplifier need to be included, there has been a problem of making the circuit larger in size and more complicated.

In addition, there has also been a problem in that no selected line can achieve a wider bandwidth in such a case in which the frequency bandwidth of an input signal is wider than the bandwidth covered by each line provided at the output of the carrier amplifier.

One or more embodiments according to this disclosure have been made to solve such problems as described above, and an object thereof is to achieve a Doherty amplifier capable of achieving a wider bandwidth without making a circuit larger in size or more complicated.

Solution to Problem

A Doherty amplifier according to the present disclosure includes: a divider for dividing a signal to be amplified; a carrier amplifier for amplifying one of signals obtained by division by the divider; a 90-degree line having one end connected with an output of the carrier amplifier; a peaking amplifier for amplifying another of the signals obtained by the division by the divider; and a combiner for combining a signal passing through the 90-degree line and a signal obtained by amplification by the peaking amplifier, and outputting a resultant combined signal, wherein a compensation circuit, arranged between the peaking amplifier and the combiner, for causing an impedance seen from an output end of the compensation circuit toward the peaking amplifier to be open within a used frequency range and compensating for frequency dependence of an impedance seen from an output of the combiner toward the combiner, in a state in which the peaking amplifier is not operating.

Advantageous Effects of Invention

According to a Doherty amplifier disclosed by this application, since the compensation circuit, which causes the impedance seen from the output end of the compensation circuit toward the peaking amplifier to be open within the used frequency range and compensates for the frequency dependence of the impedance seen from the output of the combiner toward the combiner in a state in which the peaking amplifier is not operating, is arranged between the peaking amplifier and the combiner, an effect of achieving a wider bandwidth without making the circuit larger in size or more complicated is produced.

DESCRIPTION OF EMBODIMENTS

To describe this application in more detail, embodiments according to this disclosure will now be described with reference to the accompanying drawings.

Embodiment 1

Figure 1:
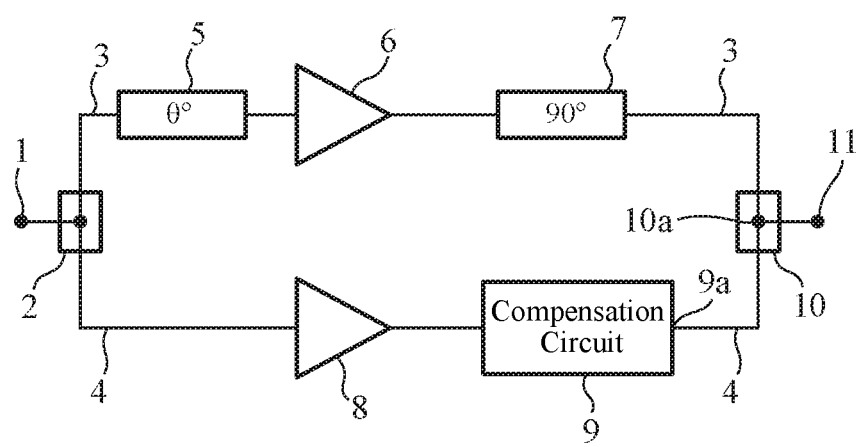
FIG. 1 is a configuration diagram of a Doherty amplifier according to Embodiment 1 in this disclosure.

FIG. 1 is a configuration diagram illustrating a Doherty amplifier according to Embodiment 1 in this disclosure.

In FIG. 1, an input terminal 1 is a terminal to which a high-frequency signal, such as a microwave or a millimeter wave, is input as a signal to be amplified.

A divider 2 divides a high-frequency signal input from the input terminal 1, outputs one of high-frequency signals obtained by the division to a signal path 3, and outputs the other of the high-frequency signals to a signal path 4.

The signal path 3 is a path from the divider 2 to a combiner 10 via a carrier amplifier 6.

The signal path 4 is a path from the divider 2 to the combiner 10 via a peaking amplifier 8.

A phase correction circuit 5 is a circuit inserted on the signal path 3 to make the electrical length of the signal path 3 and the electrical length of the signal path 4 equal to each other.

While the phase correction circuit 5 is provided in the signal path 3 in the example of FIG. 1, the phase correction circuit 5 may be provided in the signal path 4 as long as the electrical length of the signal path 3 and the electrical length of the signal path 4 are made to be equal to each other.

The carrier amplifier 6 is an amplifying element that amplifies the high-frequency signal passed through the phase correction circuit 5.

A 90-degree line 7 is a line having an electrical length of 90 degrees with one end connected with an output of the carrier amplifier 6 and the other end connected with the combiner 10.

The peaking amplifier 8 is an amplifying element that is provided in the signal path 4 and amplifies the high-frequency signal obtained by the division by the divider 2.

A compensation circuit 9 is a circuit that is provided between the peaking amplifier 8 and the combiner 10, causes the impedance seen from an output end 9a of the compensation circuit 9 toward the peaking amplifier 8 to be open within a used frequency range and compensates for the frequency dependence of the impedance seen from an output of the combiner 10 toward the combiner 10, in a state in which the peaking amplifier 8 is not operating.

Specifically, the compensation circuit 9 is a circuit that, when the impedance seen from the output of the combiner 10 toward the combiner 10 is in the capacitive region, performs compensation to bring the impedance closer to a boundary between the capacitive region and the inductive region, and that, when the impedance seen from the output of the combiner 10 toward the combiner 10 is in the inductive region, performs compensation to bring the impedance closer to the boundary between the capacitive region and the inductive region.

Note that within the used frequency range refers to within a range of frequency used by the Doherty amplifier in FIG. 1.

The combiner 10 combines the high-frequency signal passed through the 90-degree line 7 and the high-frequency signal passed through the compensation circuit 9 at a signal combining point 10a, and outputs the resulting combined high-frequency signal to an output terminal 11.

The signal combining point 10a is a connecting point at which the signal path 3 and the signal path 4 are connected with each other.

Note that the combiner 10 is simply a circuit in which the signal path 3 and the signal path 4 are connected at the signal combining point 10a and which has a signal path from the signal combining point 10a to the output terminal 11, and it is not a combiner like a so-called Wilkinson divider.

The output terminal 11 is a terminal that outputs the combined high-frequency signal output from the combiner 10 to the outside.

Next, operation will be explained.

The divider 2 divides a high-frequency signal input from the input terminal 1, outputs one of high-frequency signals obtained by the division to the signal path 3, and outputs the other of the high-frequency signals to the signal path 4.

The high-frequency signal output from the divider 2 to the signal path 3 is input to the phase correction circuit 5.

The phase correction circuit 5 has such an electrical length that the electrical length of the signal path 3 and the electrical length of the signal path 4 are equal to each other. The electrical length of the signal path 3 and the electrical length of the signal path 4 are thus made to be equal to each other by the phase correction circuit 5.

The carrier amplifier 6 amplifies the high-frequency signal passed through the phase correction circuit 5.

The high-frequency signal amplified by the carrier amplifier 6 passes through the 90-degree line 7 with an electrical length of 90 degrees and then reaches the combiner 10.

The peaking amplifier 8 amplifies the high-frequency signal obtained by the division by the divider 2.

The high-frequency signal amplified by the peaking amplifier 8 passes through the compensation circuit 9 and then reaches the combiner 10.

The combiner 10 combines the high-frequency signal passed through the 90-degree line 7 and the high-frequency signal passed through the compensation circuit 9, and outputs the resulting combined high-frequency signal to the output terminal 11.

Hereinafter, the operation of the compensation circuit 9 will be explained more specifically.

Figure 2:
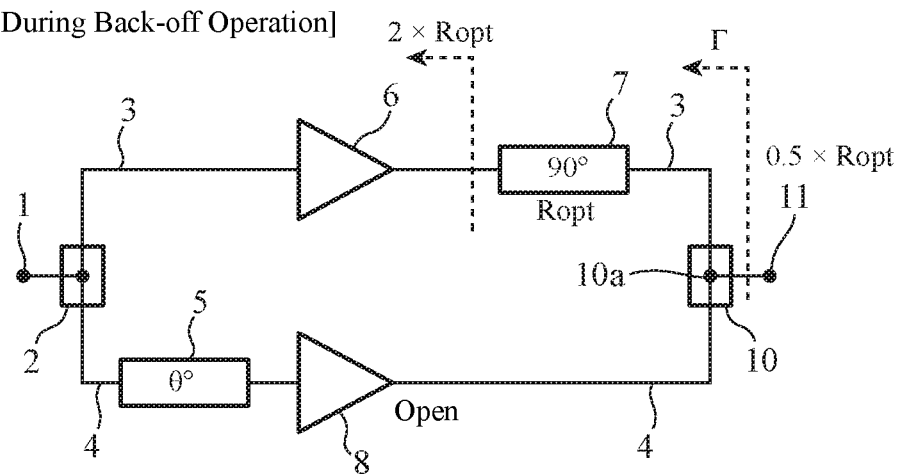
FIG. 2 is a configuration diagram illustrating a Doherty amplifier in a case in which no compensation circuit 9 is included.

FIG. 2 is a configuration diagram illustrating a Doherty amplifier in a case in which no compensation circuit 9 is included.

The Doherty amplifier of FIG. 2 is an example in which the compensation circuit 9 is not included. Because of this, the electrical length of the signal path 4 in FIG. 2 is shorter than that of the signal path 4 in the Doherty amplifier shown in FIG. 1, and thus the phase correction circuit 5 is provided in the signal path 4 in the example.

FIG. 2 illustrates impedance transformation in a state in which the peaking amplifier 8 is not operating (hereinafter referred to as "during back-off operation."

When the output impedance of the Doherty amplifier is Ropt, the output load of the carrier amplifier 6 is typically twice the output impedance Ropt of the Doherty amplifier during back-off operation.

Thus, in FIG. 2, the impedance seen from the output of the carrier amplifier 6 toward the carrier amplifier 6 is 2×Ropt.

The peaking amplifier 8 is not operating, and the output impedance of the peaking amplifier 8 is open.

In addition, in FIG. 2, the characteristic impedance of the 90-degree line 7 is Ropt, and the electrical length of the 90-degree line 7 is 90 degrees at the center frequency in the used frequency range of the Doherty amplifier.

Figure 3:
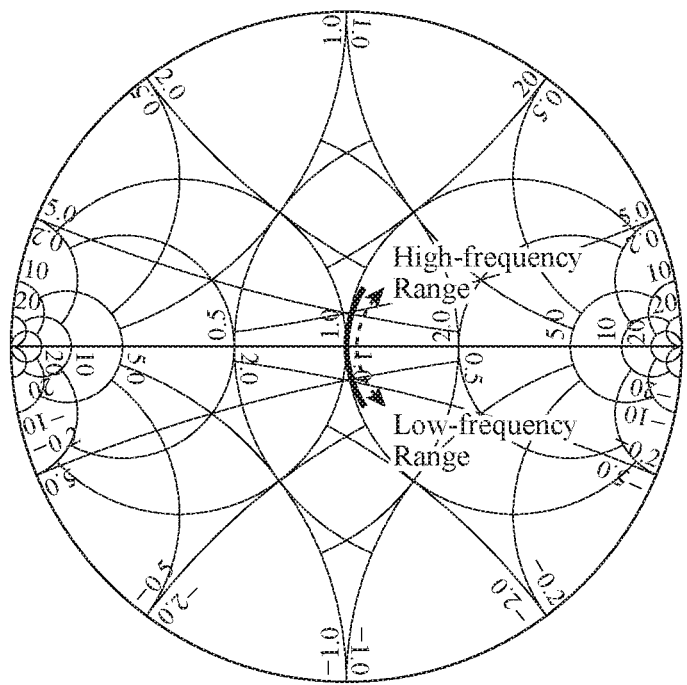
FIG. 3 is a Smith chart illustrating the frequency dependence of the impedance $\Gamma$ of a Doherty amplifier in which no compensation circuit 9 is included.

In this case, the frequency dependence of the impedance $\Gamma$ seen from the output of the combiner 10 toward the combiner 10 is expressed as in FIG. 3.

FIG. 3 is a Smith chart illustrating the frequency dependence of the impedance $\Gamma$ of a Doherty amplifier in which no compensation circuit 9 is included.

In a state in which the frequency of a high-frequency signal is equal to the center frequency in the use frequency range of the Doherty amplifier, the impedance $\Gamma$ is located at the center of the Smith chart, that is, on the horizontal axis of the Smith chart.

In a state in which the frequency of a high-frequency signal is in a low-frequency range lower than the center frequency, however, the electrical length of the 90-degree line 7 is shorter than 90 degrees, and the impedance $\Gamma$ is thus located in the capacitive region.

In addition, in a state in which the frequency of a high-frequency signal is in a high-frequency range higher than the center frequency, the electrical length of the 90-degree line 7 is longer than 90 degrees, and the impedance $\Gamma$ is thus located in the inductive region.

As a result, as the frequency of the high-frequency signal is farther away from the center frequency, reflection characteristics are deteriorated.

Next, operation in a case where the Doherty amplifier includes the compensation circuit 9 as illustrated in FIG. 1 will be described.

In this case as well, assume that the characteristic impedance of the 90-degree line 7 is Ropt, and the electrical length of the 90-degree line 7 is 90 degrees at the center frequency in the used frequency range of the Doherty amplifier.

The compensation circuit 9 has a function of causing the impedance seen from the output end 9a of the compensation circuit 9 toward the peaking amplifier 8 to be open within the used frequency range, and a function of causing the frequency characteristics to be switched to inductive (hereinafter referred to as "L-characteristic") in a state in which the frequency of a high-frequency signal is in the low-frequency range lower than the center frequency, and causing the frequency characteristics to be switched to capacitive (hereinafter referred to as "C-characteristic") in a state in which the frequency of a high-frequency signal is in the high-frequency range higher than the center frequency.

Figure 4:
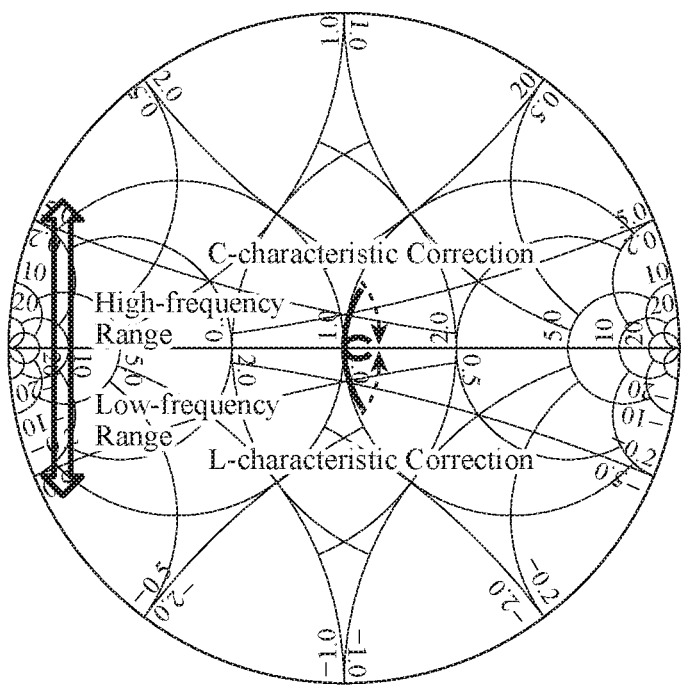
FIG. 4 is a Smith chart illustrating the frequency dependence of the impedance $\Gamma$ of a Doherty amplifier in which a compensation circuit 9 is included.

FIG. 4 is a Smith chart illustrating the frequency dependence of the impedance $\Gamma$ of a Doherty amplifier in which the compensation circuit 9 is included.

In the state in which the frequency of a high-frequency signal is in the low-frequency range lower than the center frequency, the frequency characteristic of the compensation circuit 9 is switched to the L-characteristic, and thus compensation is performed so as to bring the impedance $\Gamma$ located in the capacitive region closer to the center of the Smith chart.

In contrast, in the state in which the frequency of a high-frequency signal is in the high-frequency range higher than the center frequency, the frequency characteristic of the compensation circuit 9 is switched to the C-characteristic, and thus compensation is performed so as to bring the impedance $\Gamma$ located in the inductive region closer to the center of the Smith chart.

Figure 5:
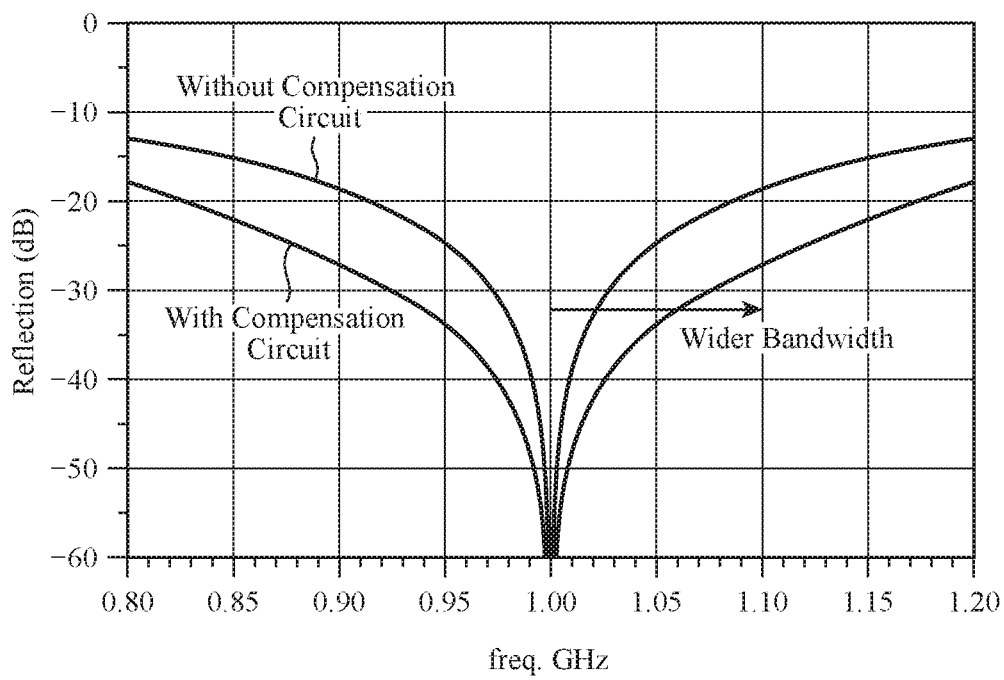
FIG. 5 is an explanatory graph illustrating the frequency dependence of reflection characteristics seen from an output of a combiner 10 toward the combiner 10.

FIG. 5 is an explanatory graph illustrating the frequency dependence of reflection characteristics seen from the output of the combiner 10 toward the combiner 10.

Since the compensation circuit 9 performs compensation so as to bring the impedance $\Gamma$ closer to the center of the Smith chart, a wider bandwidth of the Doherty amplifier is achieved as illustrated in FIG. 5.

As is clear from the description above, according to Embodiment 1, since the compensation circuit 9, which causes the impedance seen from the output end 9a of the compensation circuit 9 toward the peaking amplifier 8 to be open within the used frequency range and compensates for the frequency dependence of the impedance seen from the output of the combiner 10 toward the combiner 10 in a state in which the peaking amplifier 8 is not operating, is arranged between the peaking amplifier 8 and the combiner 10, an effect of achieving a wider bandwidth without making the circuit larger in size or more complicated is produced.

Embodiment 2

In Embodiment 1 described above, the Doherty amplifier in which the compensation circuit 9 is arranged between the peaking amplifier 8 and the combiner 10 has been presented. In Embodiment 2, a Doherty amplifier in which a compensation circuit 9 is a frequency dependence compensating line having an electrical length of an integer multiple of 180 degrees within the used frequency range will be described.

Figure 6:
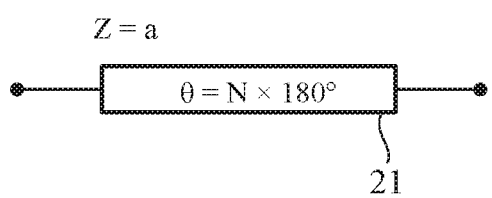
FIG. 6 is an explanatory diagram illustrating a frequency dependence compensating line 21, which is a compensation circuit of a Doherty amplifier according to Embodiment 2 in this disclosure.

FIG. 6 is an explanatory diagram illustrating a frequency dependence compensating line 21, which is a compensation circuit of the Doherty amplifier according to Embodiment 2 in this disclosure.

In FIG. 6, the frequency dependence compensating line 21 is a line having an electrical length $\theta$ of an integer multiple of 180 degrees at the center frequency in the used frequency range and having a characteristic impedance Z=a.

In FIG. 6, N is a natural number.

Figure 7:
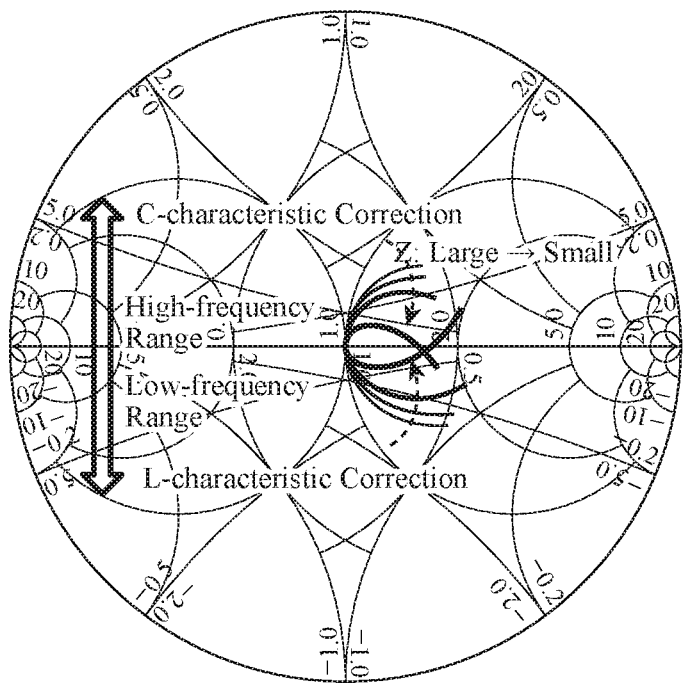
FIG. 7 is a Smith chart illustrating the frequency dependence of the impedance $\Gamma$ of the Doherty amplifier in which the frequency dependence compensating line 21 is included.

FIG. 7 is a Smith chart illustrating the frequency dependence of the impedance Γ of the Doherty amplifier in which the frequency dependence compensating line 21 is included.

FIG. 7 illustrates an example in which the electrical length θ of the frequency dependence compensating line 21 is 360 degrees (=2×180 degrees) within the used frequency range. In other words, FIG. 7 illustrates an example in which N=2.

In a state in which the frequency of a high-frequency signal is in the low-frequency range lower than the center frequency, compensation is performed so as to bring the impedance Γ located in the capacitive region closer to the center of the Smith chart by using the L-characteristic of the frequency dependence compensating line 21.

In contrast, in a state in which the frequency of the high-frequency signal is in the high-frequency range higher than the center frequency, compensation is performed so as to bring the impedance Γ closer to the center of the Smith chart by using the C-characteristic of the frequency dependence compensating line 21.

It can be seen in FIG. 7 that the compensation amount of the impedance varies according to the characteristic impedance Z of the frequency dependence compensating line 21.

As the characteristic impedance Z of the frequency dependence compensating line 21 is smaller, the L-characteristic of the frequency dependence compensating line 21 at the same frequency is higher.

The characteristic impedance Z of the frequency dependence compensating line 21 is determined by the frequency dependences of the carrier amplifier 6 and the 90-degree line 7 and the band characteristics required for the Doherty amplifier.

As is clear from the description above, according to Embodiment 2, since the frequency dependence compensating line 21 having an electrical length of an integer multiple of 180 degrees within the used frequency range is included as the compensation circuit 9, an effect of achieving a wider bandwidth without making the circuit larger in size or more complicated is produced similarly to Embodiment 1.

While an example in which the frequency dependence compensating line 21 has an electrical length θ of an integer multiple of 180 degrees at the center frequency in the used frequency range has been presented in Embodiment 2, the frequency dependence compensating line 21 only needs to have an electrical length θ of an integer multiple of 180 degrees within the used frequency range, and need not necessarily have the electrical length θ of an integer multiple of 180 degrees at the center frequency.

Embodiment 3

In Embodiment 2 described above, use of the frequency dependence compensating line 21, which has an electrical length θ of an integer multiple of 180 degrees at the center frequency within the used frequency range and has a characteristic impedance Z=a, as the compensation circuit 9 has been presented. In Embodiment 3, use of a frequency dependence compensating line 22, which has an electrical length θ of an integer multiple of 180 degrees at the center frequency within the used frequency range and has the same characteristic impedance as the output impedance of the combiner 10, as the compensation circuit 9 will be described.

Figure 8:
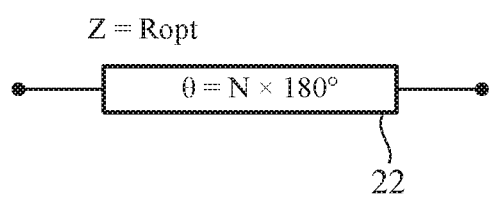
FIG. 8 is an explanatory diagram illustrating a frequency dependence compensating line 22, which is a compensation circuit of a Doherty amplifier according to Embodiment 3 in this disclosure.

FIG. 8 is an explanatory diagram illustrating the frequency dependence compensating line 22, which is a compensation circuit of a Doherty amplifier according to Embodiment 3 in this disclosure.

In FIG. 8, the frequency dependence compensating line 22 is a line having an electrical length θ of an integer multiple of 180 degrees at the center frequency in the used frequency range and having the same characteristic impedance Z=Ropt as the output impedance of the combiner 10.

Figure 9:
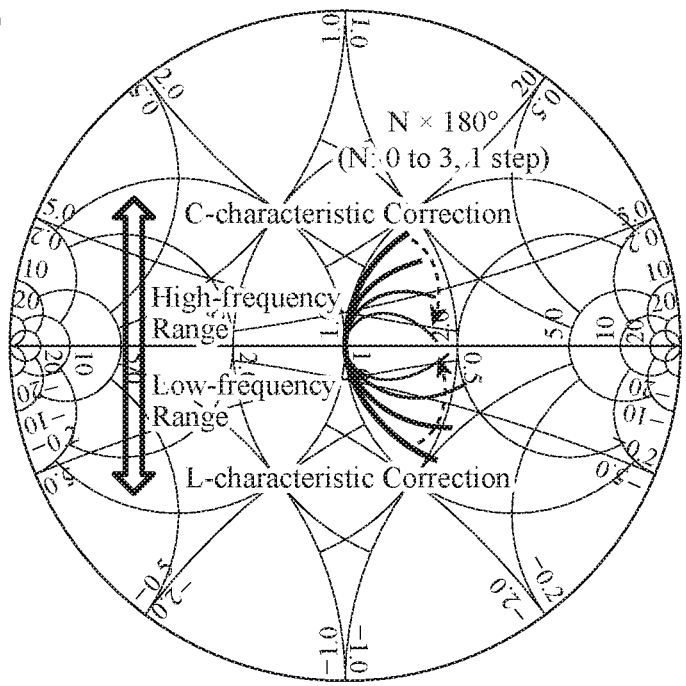
FIG. 9 is a Smith chart illustrating the frequency dependence of the impedance $\Gamma$ of the Doherty amplifier in which the frequency dependence compensating line 22 is included.

FIG. 9 is a Smith chart illustrating the frequency dependence of the impedance Γ of the Doherty amplifier in which the frequency dependence compensating line 22 is included.

In a state in which the frequency of a high-frequency signal is in the low-frequency range lower than the center frequency, compensation is performed so as to bring the impedance Γ located in the capacitive region closer to the center of the Smith chart by using the L-characteristic of the frequency dependence compensating line 22.

In contrast, in a state in which the frequency of the high-frequency signal is in the high-frequency range higher than the center frequency, compensation is performed so as to bring the impedance Γ closer to the center of the Smith chart by using the C-characteristic of the frequency dependence compensating line 22.

It can be seen in FIG. 9 that the compensation amount of the impedance varies according to the electrical length θ of the frequency dependence compensating line 22.

As the electrical length θ of the frequency dependence compensating line 22 is longer, the L-characteristic of the frequency dependence compensating line 22 at the same frequency is higher.

The electrical length θ of the frequency dependence compensating line 22 is determined by the frequency dependences of the carrier amplifier 6 and the 90-degree line 7 and the band characteristics required of the Doherty amplifier.

As is clear from the description above, according to Embodiment 3, since the frequency dependence compensating line 22 having an electrical length of an integer multiple of 180 degrees within the used frequency range is included as the compensation circuit 9, an effect of achieving a wider bandwidth without making the circuit larger in size or more complicated is produced similarly to Embodiment 1.

While an example in which the frequency dependence compensating line 22 has an electrical length θ of an integer multiple of 180 degrees at the center frequency in the used frequency range has been presented in Embodiment 3, the frequency dependence compensating line 22 only needs to have an electrical length θ of an integer multiple of 180 degrees within the used frequency range, and need not necessarily have the electrical length θ of an integer multiple of 180 degrees at the center frequency.

Embodiment 4

In Embodiment 1 described above, the Doherty amplifier in which the compensation circuit 9 is arranged between the peaking amplifier 8 and the combiner 10 has been presented. In Embodiment 4, a Doherty amplifier including, as the compensation circuit 9, a frequency dependence compensating line 23 in which a plurality of lines each having an electrical length θ of 180 degrees are connected in series and in which the lines having different characteristic impedances from one another will be described.

FIG. 10 illustrates explanatory diagrams illustrating frequency dependence compensating lines 23, which are each a compensation circuit of the Doherty amplifier according to Embodiment 4 of in this disclosure.

Figure 10A:
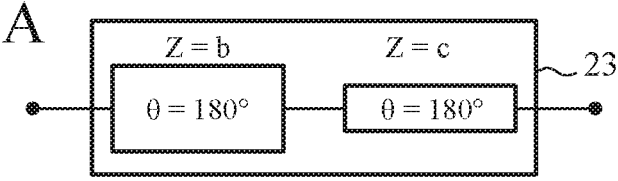
FIG. 10A is an explanatory diagram illustrating a frequency dependence compensating line 23 in which a line having an electrical length $\theta$ of 180 degrees and a characteristic impedance Z=b and a line having an electrical length $\theta$ of 180 degrees and a characteristic impedance Z=c are connected in series.

FIG. 10A is an explanatory diagram illustrating a frequency dependence compensating line 23 in which a line having an electrical length θ of 180 degrees and a characteristic impedance Z=b and a line having an electrical length θ of 180 degrees and a characteristic impedance Z=c are connected in series.

Figure 10B:
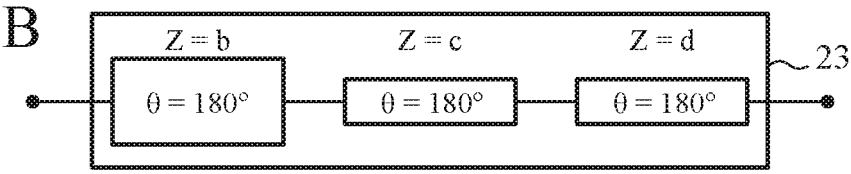
FIG. 10B is an explanatory diagram illustrating a frequency dependence compensating line 23 in which a line having an electrical length θ of 180 degrees and a characteristic impedance Z=b, a line having an electrical length θ of 180 degrees and a characteristic impedance Z=c, and a line having an electrical length θ of 180 degrees and a characteristic impedance Z=d are connected in series.

FIG. 10B is an explanatory diagram illustrating a frequency dependence compensating line 23 in which a line having an electrical length θ of 180 degrees and a characteristic impedance Z=b, a line having an electrical length θ of 180 degrees and a characteristic impedance Z=c, and a line having an electrical length θ of 180 degrees and a characteristic impedance Z=d are connected in series.

In either of the frequency dependence compensating lines 23 illustrated in FIGS. 10A and 10B, although the lines that are connected are different in characteristic impedance Z, because the lines all having the electrical length θ of 180 degrees are connected in series, the impedance at the input and the impedance at the output of each of the frequency dependence compensating lines 23 are matched.

In a state in which the frequency of a high-frequency signal is in the low-frequency range lower than the center frequency, compensation is performed so as to bring the impedance Γ located in the capacitive region closer to the center of the Smith chart by using the L-characteristic of the frequency dependence compensating lines 23.

In contrast, in a state in which the frequency of the high-frequency signal is in the high-frequency range higher than the center frequency, compensation is performed so as to bring the impedance Γ closer to the center of the Smith chart by using the C-characteristic of the frequency dependence compensating lines 23.

The compensation amount of the impedance in each of the frequency dependence compensating lines 23 varies according to the characteristic impedance Z of the frequency dependence compensating line 23.

As the characteristic impedance Z of the frequency dependence compensating line 23 is smaller, the L-characteristic of the frequency dependence compensating line 23 at the same frequency is higher.

The characteristic impedance Z of the frequency dependence compensating line 23 is determined by the frequency dependences of the carrier amplifier 6 and the 90-degree line 7 and the band characteristics required for the Doherty amplifier.

As is clear from the description above, according to Embodiment 4, since the frequency dependence compensating line 23, in which a plurality of lines having the electrical length θ of 180 degrees are connected in series and the line have different characteristic impedances from one another, is included as the compensation circuit 9, an effect of achieving a wider bandwidth without making the circuit larger in size or more complicated is produced similarly to Embodiment 1.

While an example in which the electrical lengths θ of a plurality of lines in the frequency dependence compensating line 23 are integer multiples of 180 degrees has been presented in Embodiment 4, the electrical lengths θ only need to be integer multiples of 180 degrees within the used frequency range, and need not necessarily be integer multiples of 180 degrees at the center frequency in the used frequency range.

Embodiment 5

In Embodiment 1 described above, the Doherty amplifier in which the compensation circuit 9 is arranged between the peaking amplifier 8 and the combiner 10 has been presented. In Embodiment 5, a Doherty amplifier including, as the compensation circuit 9, a frequency dependence compensating line 24 in which a plurality of lines having electrical lengths θ of integer multiples of 90 degrees are connected in series and in which the characteristic impedance and the electrical length of a line present on the input side of a line present at the central position in the signal transmitting direction and the characteristic impedance and the electrical length of a line present on the output side of the line present at the central position among the lines are symmetric will be described.

FIG. 11 illustrates explanatory diagrams illustrating frequency dependence compensating lines 24, which are each a compensation circuit of the Doherty amplifier according to Embodiment 5 in this disclosure.

Figure 11A:
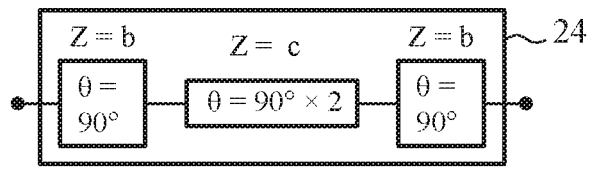
FIG. 11A is an explanatory diagram illustrating a frequency dependence compensating line 24 in which a line having an electrical length θ of 90 degrees and a characteristic impedance Z=b, a line having an electrical length θ of 180 degrees and a characteristic impedance Z=c, and a line having an electrical length θ of 90 degrees and a characteristic impedance Z=b are connected in series.

FIG. 11A is an explanatory diagram illustrating a frequency dependence compensating line 24 in which a line having an electrical length θ of 90 degrees and a characteristic impedance Z=b, a line having an electrical length θ of 180 degrees and a characteristic impedance Z=c, and a line having an electrical length θ of 90 degrees and a characteristic impedance Z=b are connected in series.

Figure 11B:
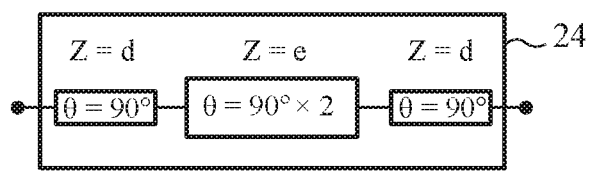
FIG. 11B is an explanatory diagram illustrating a frequency dependence compensating line 24 in which a line having an electrical length θ of 90 degrees and a characteristic impedance Z=d, a line having an electrical length θ of 180 degrees and a characteristic impedance Z=e, and a line having an electrical length θ of 90 degrees and a characteristic impedance Z=d are connected in series.

FIG. 11B is an explanatory diagram illustrating a frequency dependence compensating line 24 in which a line having an electrical length θ of 90 degrees and a characteristic impedance Z=d, a line having an electrical length θ of 180 degrees and a characteristic impedance Z=e, and a line having an electrical length θ of 90 degrees and a characteristic impedance Z=d are connected in series.

Figure 11C:
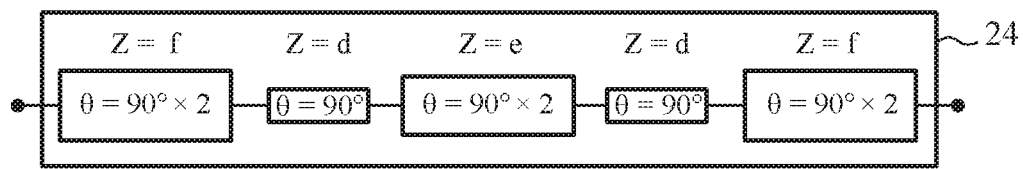
FIG. 11C is an explanatory diagram illustrating a frequency dependence compensating line 24 in which a line having an electrical length θ of 180 degrees and a characteristic impedance Z=f, a line having an electrical length θ of 90 degrees and a characteristic impedance Z=d, a line having an electrical length θ of 180 degrees and a characteristic impedance Z=e, a line having an electrical length θ of 90 degrees and a characteristic impedance Z=d, and a line having an electrical length θ of 180 degrees and a characteristic impedance Z=f are connected in series.

FIG. 11C is an explanatory diagram illustrating a frequency dependence compensating line 24 in which a line having an electrical length θ of 180 degrees and a characteristic impedance Z=f, a line having an electrical length θ of 90 degrees and a characteristic impedance Z=d, a line having an electrical length θ of 180 degrees and a characteristic impedance Z=e, a line having an electrical length θ of 90 degrees and a characteristic impedance Z=d, and a line having an electrical length θ of 180 degrees and a characteristic impedance Z=f are connected in series.

In the frequency dependence compensating line 24 illustrated in FIG. 11A, a line present at the central position in the signal transmitting direction is the line having an electrical length θ of 180 degrees and a characteristic impedance Z=c (hereinafter referred to as a "central line"), and the characteristic impedances and the electrical lengths of the line on the left and the line on the right of the central line in FIG. 11A are symmetric with respect to the central line.

Specifically, the line on the left and the line on the right both have an electrical length θ of 90 degrees and a characteristic impedance Z=b.

In addition, in the frequency dependence compensating line 24 illustrated in FIG. 11B, a line present at the central position in the signal transmitting direction is the line having an electrical length θ of 180 degrees and a characteristic impedance Z=e (hereinafter referred to as a "central line"), and the characteristic impedances and the electrical lengths of the line on the left and the line on the right of the central line in FIG. 11B are symmetric with respect to the central line.

Specifically, the line on the left and the line on the right both have an electrical length θ of 90 degrees and a characteristic impedance Z=d.

In the frequency dependence compensating line 24 illustrated in FIG. 11C, a line present at the central position in the signal transmitting direction is the line having an electrical length θ of 180 degrees and a characteristic impedance Z=e (hereinafter referred to as a "central line"), and the characteristic impedances and the electrical lengths of the line on the left and the line on the right of the central line in FIG. 11C are symmetric with respect to the central line.

Specifically, the leftmost line and the rightmost line both have an electrical length θ of 180 degrees and a characteristic impedance Z=f.

In addition, the second line from the left and the second line from the right both have an electrical length θ of 90 degrees and a characteristic impedance Z=d.

Thus, since the characteristic impedance and the electrical length of the line on the input side and the characteristic impedance and the electrical length of the line on the output side of the central line are symmetric in each of the frequency dependence compensating lines 24 illustrated in FIGS. 11A, 11B, and 11C, the impedance at the input and the impedance at the output of each of the frequency dependence compensating lines 24 are matched.

In a state in which the frequency of a high-frequency signal is in the low-frequency range lower than the center frequency, compensation is performed so as to bring the impedance Γ located in the capacitive region closer to the center of the Smith chart by using the L-characteristic of the frequency dependence compensating lines 24.

In contrast, in a state in which the frequency of the high-frequency signal is in the high-frequency range higher than the center frequency, compensation is performed so as to bring the impedance Γ closer to the center of the Smith chart by using the C-characteristic of the frequency dependence compensating lines 24.

The compensation amount of the impedance in each of the frequency dependence compensating lines 24 varies according to the characteristic impedance Z of the frequency dependence compensating line 24.

As the characteristic impedance Z of the frequency dependence compensating line 24 is smaller, the L-characteristic of the frequency dependence compensating line 24 at the same frequency is higher.

The characteristic impedance Z of the frequency dependence compensating line 24 is determined by the frequency dependences of the carrier amplifier 6 and the 90-degree line 7 and the band characteristics required for the Doherty amplifier.

As is clear from the description above, according to Embodiment 5, since the frequency dependence compensating line 24, in which a plurality of lines having electrical lengths 9 of integer multiples of 90 degrees are connected in series and in which the characteristic impedance and the electrical length of the line present on the input side and the characteristic impedance and the electrical length of the line present on the output side of the line present at the central position among the lines are symmetric, is included as the compensation circuit 9, an effect of achieving a wider bandwidth without making the circuit larger in size or more complicated is produced similarly to Embodiment 1.

While an example in which the electrical lengths θ of a plurality of lines in the frequency dependence compensating line 24 are integer multiples of 90 degrees has been presented in Embodiment 5, the electrical lengths θ only need to be integer multiples of 90 degrees within the used frequency range, and need not necessarily be integer multiples of 90 degrees at the center frequency in the used frequency range.

Embodiment 6

In Embodiment 1 described above, the Doherty amplifier in which the compensation circuit 9 is arranged between the peaking amplifier 8 and the combiner 10 has been presented.

In Embodiment 6, a Doherty amplifier including, as the compensation circuit 9, a frequency dependence compensating line 25 in which a plurality of lines having electrical lengths θ of integer multiples of 90 degrees are connected in series, in which the electrical length of a line present on the input side and the electrical length of a line present on the output side of a line present at the central position in the signal transmitting direction among the lines are symmetric, and in which the characteristic impedance of the line on the input side and the characteristic impedance of the line on the output side are asymmetric will be described.

Figure 12:
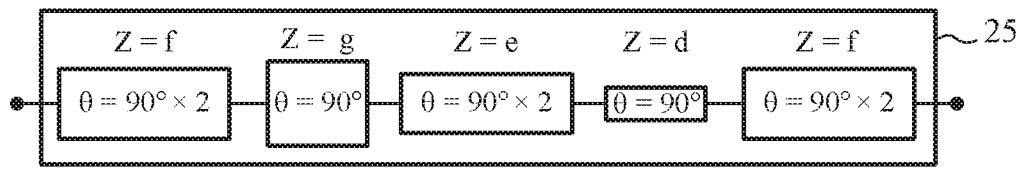
FIG. 12 is an explanatory diagram illustrating a frequency dependence compensating line 25, which is a compensation circuit of a Doherty amplifier according to Embodiment 6 in this disclosure.

FIG. 12 is an explanatory diagram illustrating the frequency dependence compensating line 25, which is a compensation circuit of the Doherty amplifier according to Embodiment 6 in the present disclosure.

Specifically, FIG. 12 is an explanatory diagram illustrating the frequency dependence compensating line 25 in which a line having an electrical length θ of 180 degrees and a characteristic impedance Z=f, a line having an electrical length θ of 90 degrees and a characteristic impedance Z=g, a line having an electrical length θ of 180 degrees and a characteristic impedance Z=e, a line having an electrical length θ of 90 degrees and a characteristic impedance Z=d, and a line having an electrical length θ of 180 degrees and a characteristic impedance Z=f are connected in series.

In the frequency dependence compensating line 25 illustrated in FIG. 12, a line present at the central position in the signal transmitting direction is the line having an electrical length θ of 180 degrees and a characteristic impedance Z=e (hereinafter referred to as a "central line"), and the electrical lengths of the line on the left and the line on the right of the central line in FIG. 12 are symmetric with respect to the central line.

Specifically, the leftmost line and the rightmost line both have an electrical length θ of 180 degrees and a characteristic impedance Z=f, and the electrical lengths and the characteristic impedances are thus symmetric.

The second line from the left and the second line from the right both have an electrical length θ of 90 degrees, and the electrical lengths are thus symmetric. The second line from the left, however, has a characteristic impedance Z=g while the second line from the right has a characteristic impedance Z=d, and the characteristic impedances are thus asymmetric.

In a state in which the frequency of a high-frequency signal is in the low-frequency range lower than the center frequency, compensation is performed so as to bring the impedance Γ located in the capacitive region closer to the center of the Smith chart by using the L-characteristic of the frequency dependence compensating lines 25.

In contrast, in a state in which the frequency of the high-frequency signal is in the high-frequency range higher than the center frequency, compensation is performed so as to bring the impedance Γ located in the inductive region closer to the center of the Smith chart by using the C-characteristic of the frequency dependence compensating lines 25.

In Embodiment 6, since the frequency dependence compensating line 25, in which the electrical length of the line present on the input side and the electrical length of the line present on the output side of the central line present at the central position in the signal transmitting direction are symmetric, is included as the compensation circuit 9, an effect of achieving a wider bandwidth without making the circuit larger in size or more complicated is produced similarly to Embodiment 1.

In addition, in Embodiment 6, since the characteristic impedance of the line present on the input side and the characteristic impedance of the line present on the output side of the central line are asymmetric, the impedance at the input and the impedance at the output of the frequency dependence compensating line 25 are not equal to each other. The compensation circuit 9 thus includes an impedance converting function.

Embodiment 7

In Embodiment 1 described above, the Doherty amplifier in which the compensation circuit 9 is arranged between the peaking amplifier 8 and the combiner 10 has been presented. In Embodiment 7, a parasitic reactance inside a peaking amplifier 8 may also function as part of a compensation circuit 30.

Figure 13:
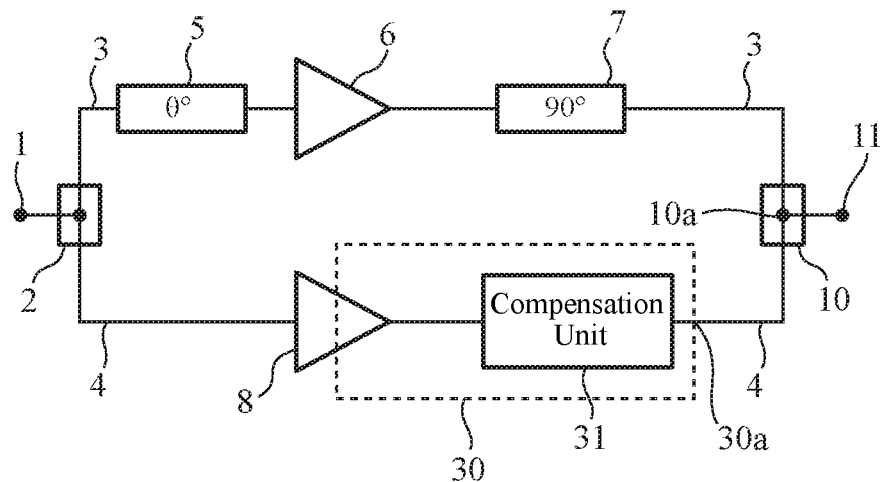
FIG. 13 is a configuration diagram illustrating a Doherty amplifier according to Embodiment 7 in this disclosure.

FIG. 13 is a configuration diagram illustrating a Doherty amplifier according to Embodiment 7 in the present disclosure, in which the same reference numerals as those in FIG. 1 represent the same or corresponding components and the description thereof will thus not be repeated.

The compensation circuit 30 is a circuit that causes the impedance seen from an output end 30a of the compensation circuit 30 toward the peaking amplifier 8 to be open within the used frequency range and compensates for the frequency dependence of the impedance seen from the output of the combiner 10 in a state in which the peaking amplifier 8 is not operating, similarly to the compensation circuit 9 in FIG. 1.

The compensation circuit 30, however, has such an electrical length that a sum of the electrical length of the compensation circuit 30 and the electrical length of the parasitic reactance inside the peaking amplifier 8 is an integer multiple of 180 degrees within the used frequency range, unlike the compensation circuit 9 of FIG. 1.

Specifically, the compensation circuit 30 includes a compensation unit 31, which has such an electrical length that a sum of the electrical length of the compensation unit 31 and the electrical length of the parasitic reactance inside the peaking amplifier 8 is an integer multiple of 180 degrees within the used frequency range.

While the phase correction circuit 5 is arranged on the signal path 3 in the example of FIG. 13, the phase correction circuit 5 may be arranged on the signal path 4 as long as the electrical length of the signal path 3 and the electrical length of the signal path 4 are made to be equal to each other.

Figure 14:
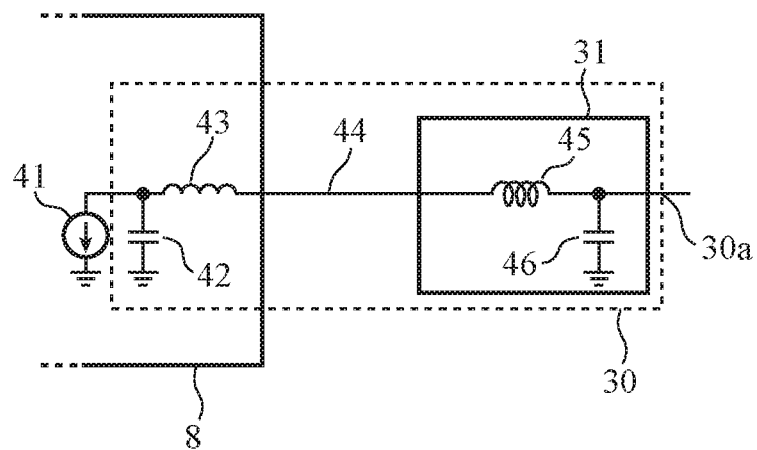
FIG. 14 is a configuration diagram illustrating a compensation circuit 30 of a Doherty amplifier according to Embodiment 7 in this disclosure.

FIG. 14 is a configuration diagram illustrating the compensation circuit 30 of the Doherty amplifier according to Embodiment 7 in the present disclosure.

In FIG. 14, a current source 41 represents a transistor as an amplifying element in the peaking amplifier 8.

A parasitic capacitance component 42 and a parasitic inductance component 43 are added as the parasitic reactance inside the peaking amplifier 8 to the current source 41 in the peaking amplifier 8.

A signal path 44 is a path through which a high-frequency signal amplified by the peaking amplifier 8 is transmitted to the compensation unit 31.

The compensation unit 31 includes an inductor 45 and a capacitor 46.

While an example in which the compensation unit 31 includes the inductor 45 and the capacitor 46 is illustrated in FIG. 14, the compensation unit 31 only needs to have such an electrical length that a sum of the electrical length of the compensation unit 31 and the electrical length of the parasitic reactance inside the peaking amplifier 8 is an integer multiple of 180 degrees within the used frequency range, and the compensation unit may include a line, for example.

Similarly to the compensation circuit 9 of FIG. 1, the compensation unit 31 of the compensation circuit 30 has a function of causing the impedance seen from the output end 30a of the compensation circuit 30 toward the peaking amplifier 8 to be open within the used frequency range during back-off operation, and a function of causing the frequency characteristics to be switched to the L-characteristic in a state in which the frequency of a high-frequency signal is in the low-frequency range lower than the center frequency and causing the frequency characteristics to be switched to the C-characteristic in a state in which the frequency of a high-frequency signal is in the high-frequency range higher than the center frequency.

Thus, In the state in which the frequency of a high-frequency signal is in the low-frequency range lower than the center frequency, the frequency characteristics of the compensation unit 31 are switched to the L-characteristic, and thus, compensation is performed so as to bring the impedance Γ located in the capacitive region closer to the center of the Smith chart.

In contrast, in the state in which the frequency of a high-frequency signal is in the high-frequency range higher than the center frequency, the frequency characteristics of the compensation unit 31 are switched to the C-characteristic, and thus, compensation is performed so as to bring the impedance Γ located in the inductive region closer to the center of the Smith chart.

In Embodiment 7, the parasitic reactance inside the peaking amplifier 8 also functions as part of the compensation circuit 30, and since the compensation unit 31 of the compensation circuit 30 causes the impedance seen from the output end 30a toward the peaking amplifier 8 to be open within the used frequency range and compensates for the frequency dependence of the impedance seen from the output of the combiner 10 toward combiner 10 in the state in which the peaking amplifier 8 is not operating, an effect of achieving a wider bandwidth without making the circuit larger in size or more complicated is produced, similarly to Embodiment 1.

Embodiment 8

In Embodiments 1-7 described above, it is assumed that distributed constant lines compose the phase correction circuit 5, the 90-degree line 7, and the compensation circuits 9 and 30. Alternatively, lumped parameter elements may compose the phase correction circuit 5, the 90-degree line 7, and the compensation circuits 9 and 30.

Note that the embodiments can be freely combined, any components in the embodiments can be modified, and any components in the embodiments can be omitted within the scope of the invention.

INDUSTRIAL APPLICABILITY

One or more disclosed embodiments are suitable for a Doherty amplifier in which a carrier amplifier and a peaking amplifier are connected in parallel.

REFERENCE SIGNS LIST

1: input terminal, 2: divider, 3, 4: signal path, 5: phase correction circuit, 6: carrier amplifier, 7: 90-degree line, 8: peaking amplifier, 9: compensation circuit, 9a: output end, 10: combiner, 10a: signal combining point, 11: output terminal, 21, 22, 23, 24, 25: frequency dependence compensating line, 30: compensation circuit, 30a: output end, 31:

compensation unit, 41: current source, 42: parasitic capacitance component, 43: parasitic inductance component, 44: signal path, 45: inductor, 46: capacitor.

The invention claimed is:

1. A Doherty amplifier comprising:
a divider for dividing a signal to be amplified;
a carrier amplifier for amplifying one of signals obtained by division by the divider;
a 90-degree line having one end connected with an output of the carrier amplifier;
a peaking amplifier for amplifying another of the signals obtained by the division by the divider; and
a combiner for combining a signal passing through the 90-degree line and a signal obtained by amplification by the peaking amplifier, and outputting a resultant combined signal, wherein
a compensation circuit, arranged between the peaking amplifier and the combiner, for causing an impedance seen from an output end of the compensation circuit toward the peaking amplifier to be open within a used frequency range and compensating for frequency dependence of an impedance seen from an output of the combiner toward the combiner in a state in which the peaking amplifier is not operating, and
the compensation circuit includes:
a first line having an electrical length not greater than 180 degrees, wherein a sum of an electrical length of a parasitic reactance inside the peaking amplifier and an electrical length of the first line is 180 degrees within the used frequency range, and
a second line that is loaded subsequently to the first line having the electrical length smaller than 180 degrees and has an electrical length of an integer multiple of 180 degrees within the used frequency range.

2. The Doherty amplifier according to claim 1, wherein a phase correction circuit for making an electrical length of a line from the divider to the combiner via the carrier amplifier and an electrical length of a line from the divider to the combiner via the peaking amplifier equal to each other is arranged between the divider and the carrier amplifier or the peaking amplifier.

3. The Doherty amplifier according to claim 1, wherein when the impedance seen from the output of the combiner toward the combiner is in a capacitive region, the compensation circuit performs compensation so as to bring the impedance closer to a boundary between the capacitive region and an inductive region, or when the impedance seen from the output of the combiner toward the combiner is in the inductive region, the compensation circuit performs compensation so as to bring the impedance closer to the boundary between the capacitive region and the inductive region.

4. The Doherty amplifier according to claim 1, wherein each of the 90-degree line and the compensation circuit comprises a lumped parameter element.

* * * * *